United States Patent
Farag et al.

(10) Patent No.: US 11,592,490 B2
(45) Date of Patent: Feb. 28, 2023

(54) METHOD AND DEVICE FOR ESTIMATING A VOLTAGE OF A BATTERY

(71) Applicants: Bayerische Motoren Werke Aktiengesellschaft, Munich (DE); BMW Canada Inc., Richmond Hill (CA)

(72) Inventors: Mohammed Farag, Hamilton (CA); Benno Schweiger, Munich (DE); Saeid Habibi, Hamilton (CA)

(73) Assignees: BAYERISCHE MOTOREN WERKE AKTIENGESELLSCHAFT, Munich (DE); BMW CANADA INC., Richmond Hill (CA)

( * ) Notice: Subject to any disclaimer, the term of this patent is extended or adjusted under 35 U.S.C. 154(b) by 1056 days.

(21) Appl. No.: 16/313,434

(22) PCT Filed: Jun. 28, 2016

(86) PCT No.: PCT/EP2016/065003
§ 371 (c)(1),
(2) Date: Dec. 26, 2018

(87) PCT Pub. No.: WO2018/001461
PCT Pub. Date: Jan. 4, 2018

(65) Prior Publication Data
US 2019/0162791 A1    May 30, 2019

(51) Int. Cl.
*G01R 31/367* (2019.01)
*B60L 58/12* (2019.01)
(Continued)

(52) U.S. Cl.
CPC ............ *G01R 31/367* (2019.01); *B60L 58/10* (2019.02); *B60L 58/12* (2019.02);
(Continued)

(58) Field of Classification Search
CPC .............. G01R 31/367; G01R 31/3648; G01R 31/382; G01R 31/3842; G01R 31/388;
(Continued)

(56) References Cited

U.S. PATENT DOCUMENTS

| | | |
|---|---|---|
| 2010/0085057 A1 | 4/2010 | Nishi et al. |
| 2011/0031938 A1 | 2/2011 | Ishikawa |

(Continued)

FOREIGN PATENT DOCUMENTS

| | | |
|---|---|---|
| CN | 1305590 A | 7/2001 |
| CN | 103901351 A | 7/2014 |

(Continued)

OTHER PUBLICATIONS

Guo et al (Single-Particle Model fora Lithium-Ion Cell: Thermal Behavior, 2011 J. Electrochem. Soc. 158 A122) (Year: 2011).*

(Continued)

*Primary Examiner* — Daniel R Miller
*Assistant Examiner* — Christian T Bryant
(74) *Attorney, Agent, or Firm* — Morgan, Lewis & Bockius LLP

(57) ABSTRACT

In a method for estimating a voltage of a battery a given electrochemical battery model is provided, wherein one parameter of the electrochemical battery model is an open circuit potential. The open circuit potential is linearized. The voltage of the battery is estimated by means of the electrochemical battery model with the linearized open circuit potential.

14 Claims, 6 Drawing Sheets

Figure 1:
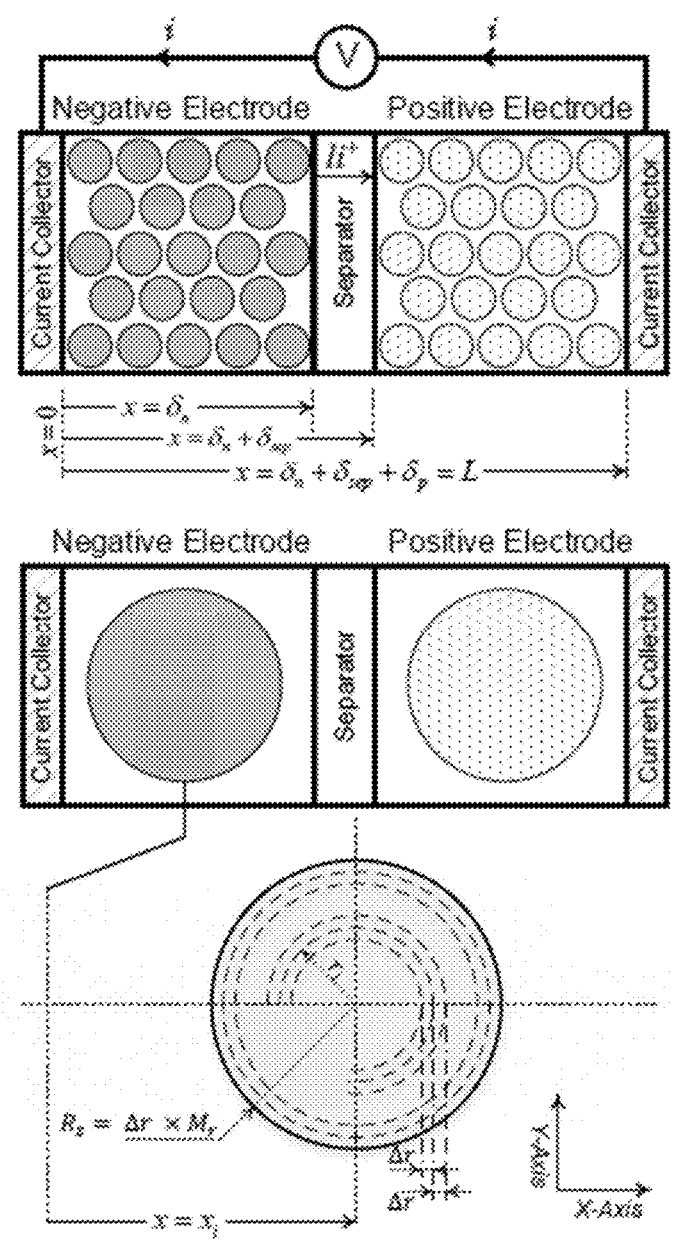

(51) Int. Cl.

| | | |
|---|---|---|
| *G01R 31/382* | (2019.01) | |
| *B60L 58/10* | (2019.01) | |
| *G01R 31/3842* | (2019.01) | |
| *G01R 31/388* | (2019.01) | |
| *H01M 10/0525* | (2010.01) | |
| *H01M 14/00* | (2006.01) | |
| *H01M 10/42* | (2006.01) | |
| *G01R 31/36* | (2020.01) | |
| *H01M 10/48* | (2006.01) | |
| *H01M 6/50* | (2006.01) | |

(52) U.S. Cl.
CPC ....... *G01R 31/3648* (2013.01); *G01R 31/382* (2019.01); *G01R 31/388* (2019.01); *G01R 31/3842* (2019.01); *H01M 10/0525* (2013.01); *H01M 10/484* (2013.01); *B60L 2240/547* (2013.01); *H01M 6/5083* (2013.01); *H01M 10/42* (2013.01); *H01M 14/00* (2013.01); *Y02E 60/10* (2013.01); *Y02T 10/70* (2013.01)

(58) Field of Classification Search
CPC .... B60L 58/10; B60L 58/12; B60L 2240/547; H01M 10/0525; H01M 10/484; H01M 6/5083; H01M 10/42; H01M 14/00; Y02T 10/70; Y02E 60/10
See application file for complete search history.

(56) References Cited

U.S. PATENT DOCUMENTS

| | | |
|---|---|---|
| 2014/0125348 A1 | 5/2014 | Ben-Aicha |
| 2014/0244193 A1* | 8/2014 | Balasingam ....... G01R 31/3835 702/63 |
| 2016/0006275 A1 | 1/2016 | Lee et al. |
| 2016/0039419 A1 | 2/2016 | Wampler et al. |

FOREIGN PATENT DOCUMENTS

| | | | |
|---|---|---|---|
| CN | 104345202 A | | 2/2015 |
| CN | 104991980 A | | 10/2015 |
| CN | 105093114 A | * | 11/2015 |
| EP | 0969539 A1 | | 1/2000 |

OTHER PUBLICATIONS

Afshari, H. et al.: "Dynamic analysis of a Li-Iron Phosphate cell using the electro-chemical modelling approach" XP032929009, Copyright 2016 IEEE.

Anonymous: "Linear regression—Wikipedia" XP055347857, Feb. 2, 2017.

Dougal, R. et al.: "Analysis of an automatic energy recovery system for partially spent batteries" XP004917755, Oct. 14, 2004.

Speltino, C.: et al.: "Comparison of reduced order lithium-ion battery models for control applications" XP031620552, Dec. 16-18, 2009.

Farag, M. et al.: "Continuous Piecewise Linearized Reduced Order Electrode Averaged Model for Real Time Applications" Elsevier, Mar. 11, 2016.

* cited by examiner

METHOD AND DEVICE FOR ESTIMATING A VOLTAGE OF A BATTERY

The invention relates to a method for estimating a voltage of a battery. The invention relates further to a corresponding device.

In the past few years, automobile manufacturers have gone through the initial adoption phase of electric mobility. The gradually increasing momentum behind electric vehicle (EV) adoption suggests that electrified storage systems will play an important role in electric mobility going forward. Lithium ion batteries have become one of the most attractive alternatives for electric vehicles' energy storage systems due to its lightweight, high specific energy, low self-discharge rate, and non-memory effect. To fully utilize the lithium ion energy storage systems and avoid its physical limitations, an accurate battery management system (BMS) is required. In EV, BMS is responsible for performance management which include—but not limited to—state of charge (SOC), state of health (SOH), state of function (SOF) estimation algorithms, power management, and thermal management, etc. One of the key issues for the BMS is the battery model. A robust, accurate, and high fidelity battery model is required to mimic the battery dynamic behaviour in harsh environment.

The object of the invention is to estimate the voltage of a battery by means of a robust, accurate, and high fidelity battery model in an efficient manner.

This object is achieved by the features of the independent claims. Advantageous embodiments of the invention are given in the sub-claims.

The invention is distinguished by a method for estimating a voltage of a battery. The invention is further distinguished by a corresponding device for estimating a voltage of a battery. In the method, a given electrochemical battery model is provided, wherein one parameter of the electrochemical battery model is an open circuit potential. The open circuit potential is linearized. The voltage of the battery is estimated by means of the electrochemical battery model with the linearized open circuit potential.

A choice between battery models is a trade-off between model complexity, accuracy, and parametrization effort. Models can be classified into three categories, starting from the most abstract to most detailed. These categories are behavioural or black-box, equivalent circuit, and electrochemical or physical based models. The equivalent circuit models can be used in the BMS because of the low computational effort and acceptable accuracy. However, they are short in describing the battery internal physical behaviour.

It is further possible to model the battery electrochemical processes. Such a model is, for example, derived from the physics-based electrochemical pseudo-two-dimensional model developed by Doyle-Fuller-Newman model, which is based on porous electrode and concentrated solutions theory. The primary gain of the rigorous physics-based P2D model is the increased accuracy/precision achieved by modelling the electrochemical processes. Unfortunately, it is high in complexity, computational time, memory allocations, and real-time control.

By providing a method wherein a given electrochemical battery model is provided, wherein the open circuit potential of the electrochemical battery model is linearized, the voltage of a battery can be estimated in a very robust and accurate manner, wherein the estimation is up to 7 times faster than an estimation by means of non-linearized electrochemical battery models. Thus, a real time estimation of the state of charge (SOC), state of health (SOH), state of function (SOF) of the battery, power management, and thermal management, etc. is possible.

According to one embodiment, the open circuit potential is linearized piece-wise with a given number of knots. By means of a piece-wise linearization a very accurate, but still, very fast estimation is possible.

According to a further embodiment the number of knots is four or five. The smaller the number of knots, the faster the estimation. The larger the number of knots, the more accurate the estimation. Four or five knots comprise an advantageous compromise for a very accurate real time estimation of the voltage.

According to a further embodiment, the knots are placed on points such that an overall squared-approximation error is minimized. By minimizing the overall squared-approximation error a very accurate estimation is achieved.

According to a further embodiment the overall squared-approximation error is minimized by means of the optimization objective function $$\min_{\lambda_1, \ldots, \lambda_{N-1}} \left\{ err = \int_{SOC^{0\%}}^{SOC^{100\%}} [U(SOC) - \omega_i(SOC)]^2 dSOC \right\}$$

wherein $\lambda_i$ is the point of the knot i,
U(SOC) is a uni-variate non-linear function of the open circuit potential, wherein $x \in [SOC^{0\%}, SOC^{100\%}]$ and SOC is the state of charge,
err is the overall squared-approximation error and
$\omega_i(SOC)$ is the piece-wise linear function of the knot i.
Hereby a very accurate estimation is achieved.

According to a further embodiment the given electrochemical battery model is based on a single particle model.

According to a further embodiment the Lithium concentration in an electrolyte ce is set as an average value in the given electrochemical battery model. At low C-rates the change of Li concentration in electrolyte ce can be considered constant. This assumption further simplifies the electrochemical battery model, so that the estimation is less complex and the computation time is shorter.

According to a further embodiment the solid particle distribution is set to be a single sphere whose surface area is scaled to that of the porous electrode in the given electrochemical battery model. This assumption further simplifies the electrochemical battery model, so that the estimation is less complex and the computation time is shorter.

According to a further embodiment the spatial dependence of the Butler-Volmer equation is set as a constant in the given electrochemical battery model. This assumption further simplifies the electrochemical battery model, so that the estimation is less complex and the computation time is shorter.

According to a further embodiment the given electrochemical battery model is based on the formula $$V(t) = (\overline{\eta_p} - \overline{\eta_n}) + (\overline{\Phi_e^p} - \overline{\Phi_e^n}) + [U_p(\theta_p) - U_n(\theta_n)] - R_f \frac{I}{A}$$

wherein $\overline{\eta_p} - \overline{\eta_n}$ is the difference between the positive and negative electrode over potentials,
$\overline{\Phi_e^p} - \overline{\Phi_e^n}$ is the difference between the positive and negative electrolyte potentials,
$U_p(\theta_p) - U_n(\theta_n)$ is the open circuit potential and $R_iI/A$ is the resistance multiplied by the current divided by the electrode plate area. The use of the above formula simplifies the electrochemical battery model, so that the estimation is less complex and the computation time is shorter.

Exemplary embodiments of the invention are explained in the following with the aid of schematic drawings.

Figure 2:
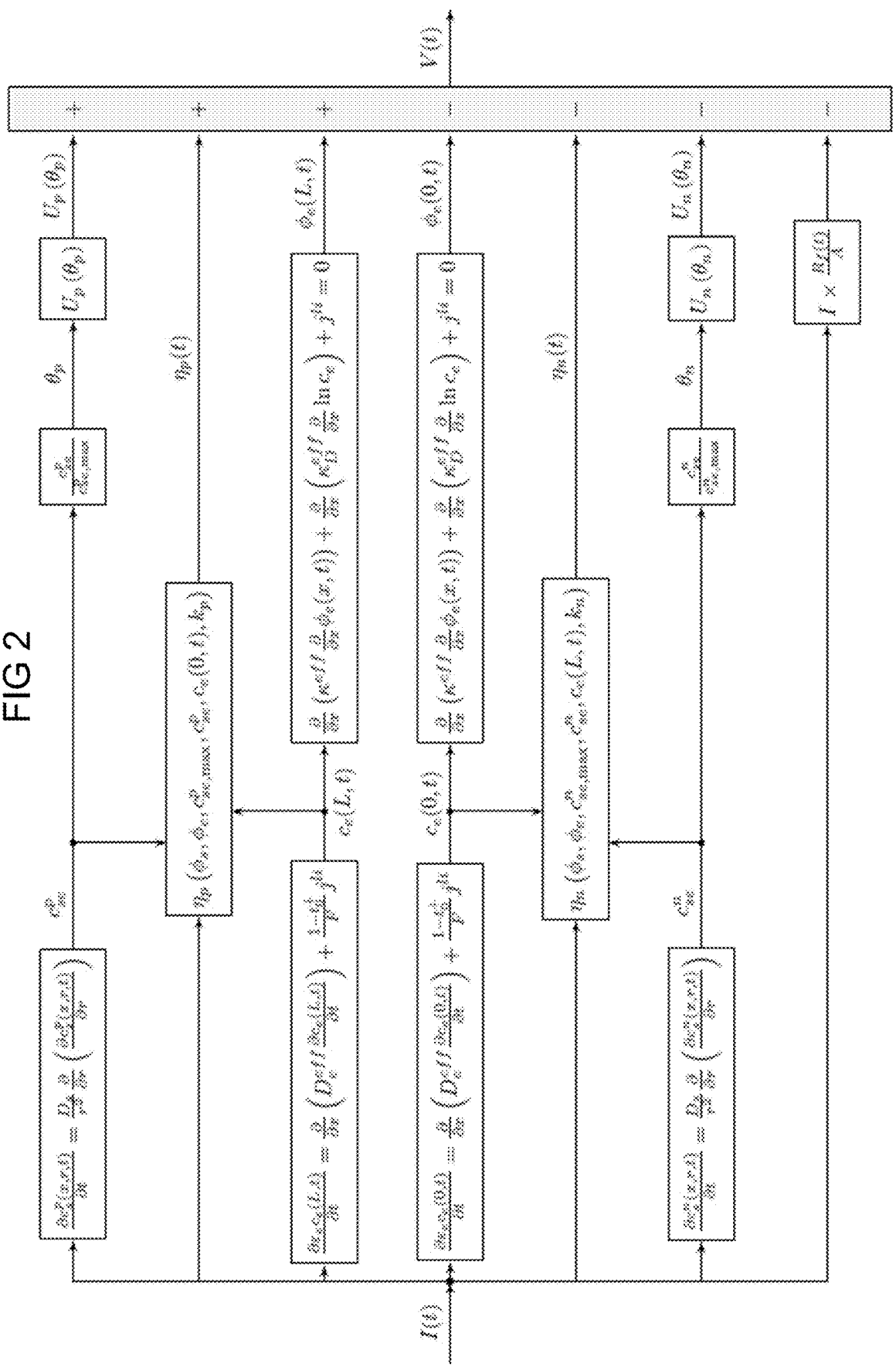
Figure 3:
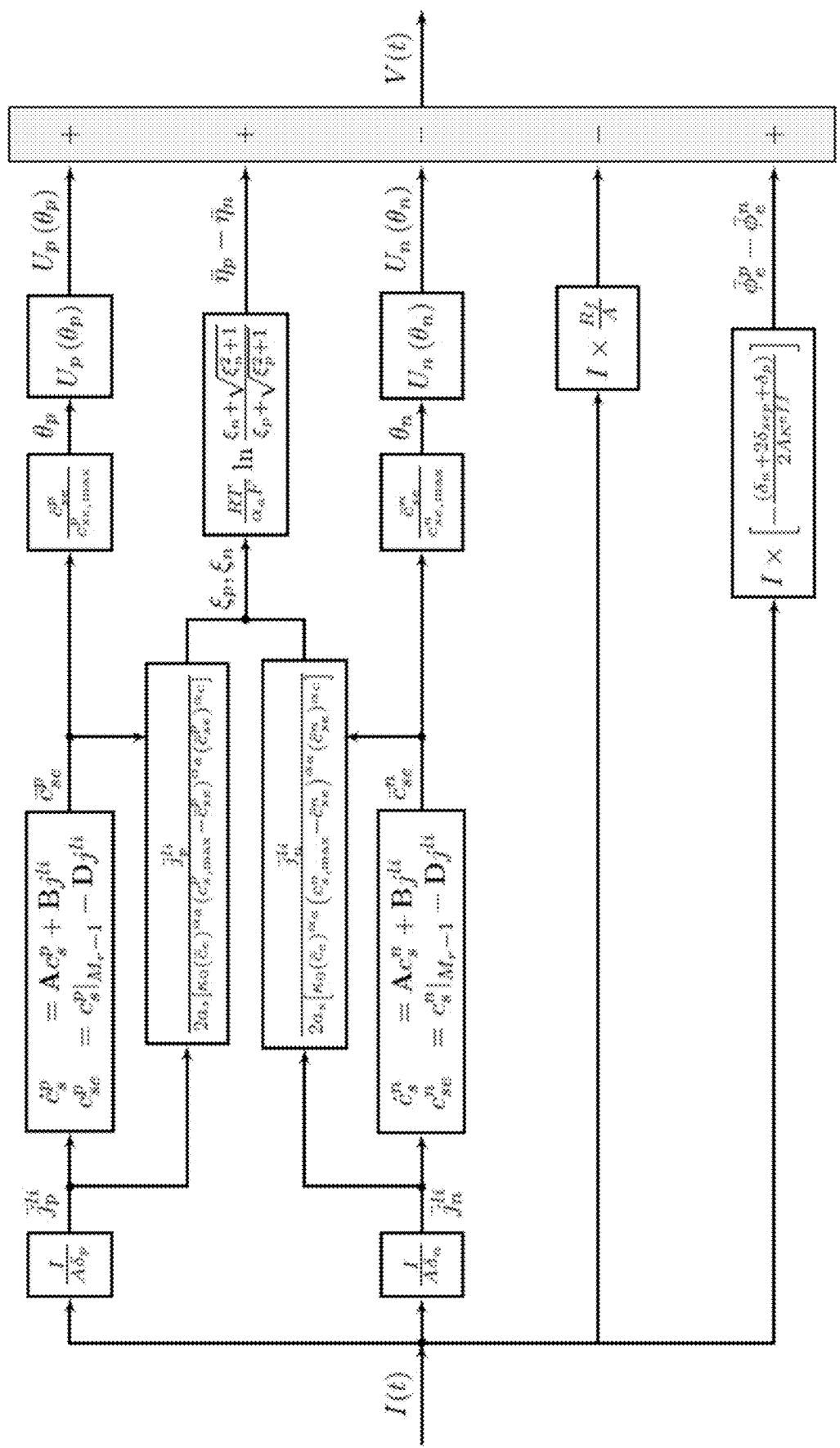
Figure 4:
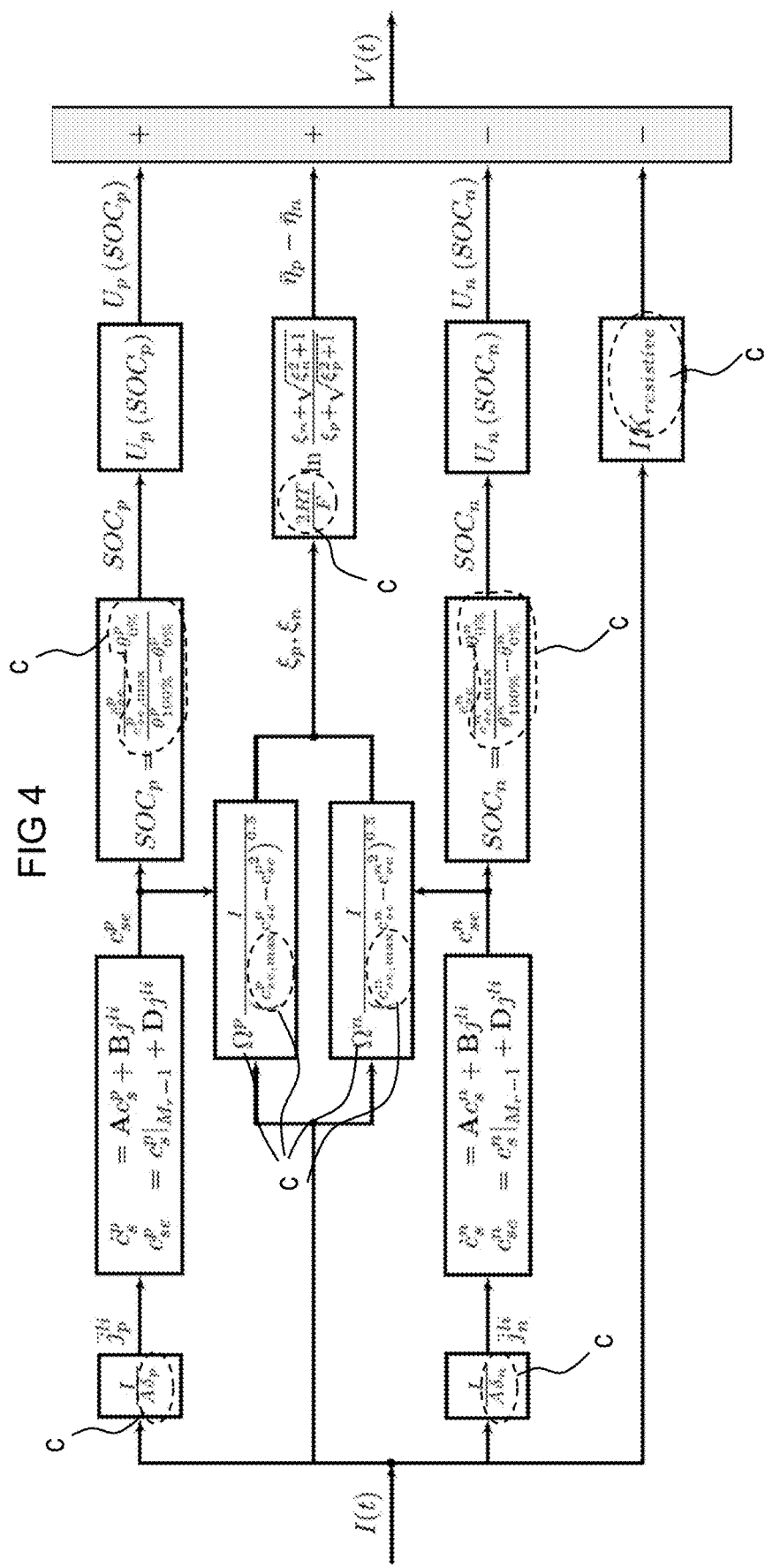
Figure 5:
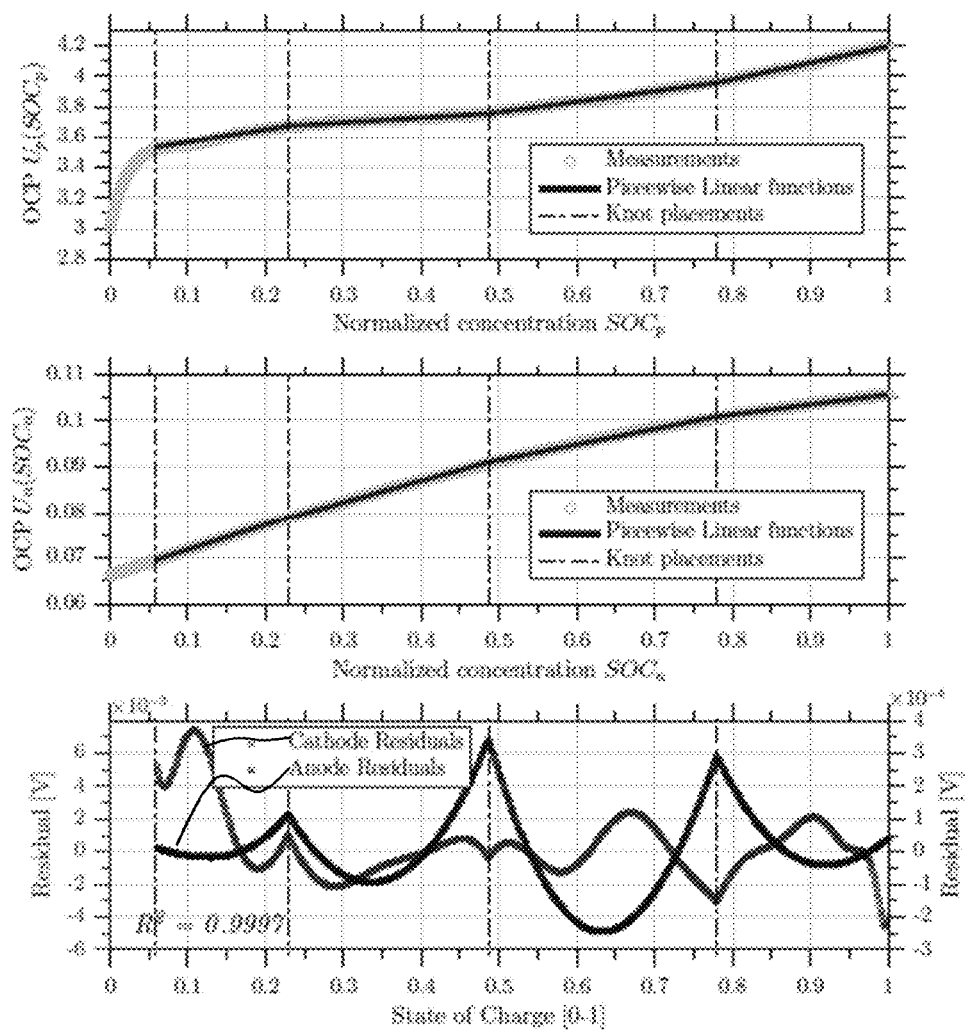
Figure 6:
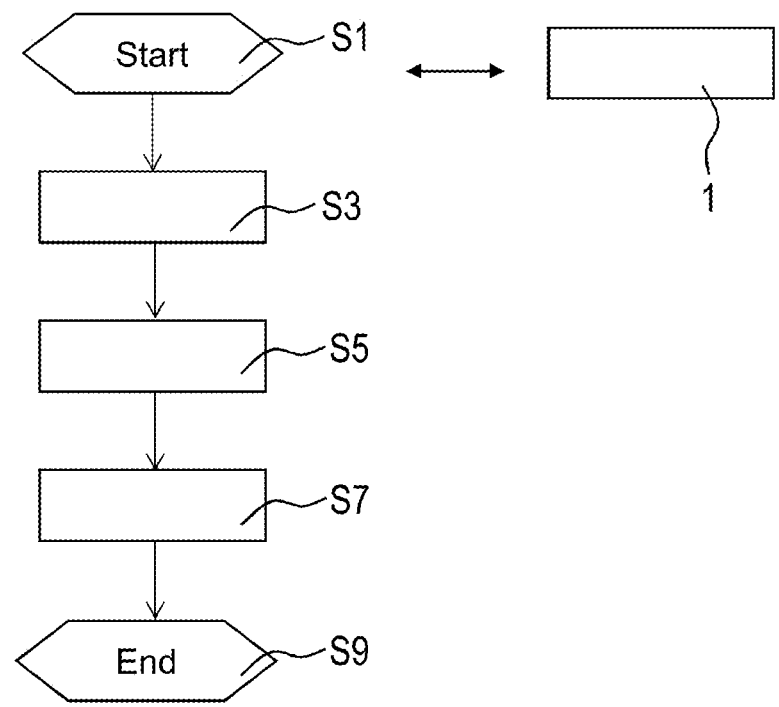

These are as follows:

FIG. 1 a schematic representation of the Li-ion battery operation principles;

FIG. 2 a block diagram of a full order electrochemical model;

FIG. 3 a block diagram of a reduced order electrochemical model;

FIG. 4 a block diagram of a reduced order electrochemical model;

FIG. 5 a comparison of experimental OCP curves and continuous piecewise linear functions obtained by optimizing joint-points; and FIG. 6 a flowchart of a program for estimating a voltage of a battery.

A battery converts chemical energy into electrical energy and vice versa. The basic setup of a battery cell consists of four main parts: the positive electrode, the separator, the electrolyte, and the negative electrode. The positive and negative electrodes are referred to as the cathode and the anode, as shown in FIG. 1. The battery is connected to an external load using current collector plates. In case of Li-ion cells, a copper collector is used in the negative electrode while an aluminium collector is used for the positive electrode.

The anode is the electrode capable of supplying electrons to the load. The anode composite material defines the name of the Li-ion battery and is usually made up of a mixture of carbon (e.g. LixC6), the cathode is usually made of metal oxides (ex. LiCoO2 or LiMn2O4), while the electrolyte can be made of liquid (e.g. LiPF6), polymer or solid materials. In case of solid or polymer materials, the electrolyte will also act also as separator.

The separator is a porous membrane allowing the transfer of lithium ions only, thus serving as a barrier for electrons between electrodes. It prevents the occurrence of short-circuit and thermal run away, while at the same time offering negligible resistance.

Under the presence of a load current, (Reduction, Oxidation) Redox reaction occurs. Oxidation reaction takes place at the anode where the trapped lithium particles start to deintercalate toward the electrolyte-solid interface splitting lithium into ions and electrons. Lithium ions transfer through the solution due to the concentration difference while the electrons move through the current collector, because the electrolyte solution acts as an electronic insulator. Reduction reaction takes place at the cathode, where the traveling lithium ions from the anode start to intercalate and react with the electrons coming from the positive collector. The whole phenomenon of intercalation and deintercalation is reversible as lithium ions pass back and forth between the electrodes during charging and discharging. In theory, this phenomenon could go on infinitely. Unfortunately, due to cell material degradation and other irreversible chemical reactions, the cell capacity and power degrades with the number of cycles and usage.

In the following an exemplary electrochemical battery model is described.

First, the mathematical equations governing the charge and species conservation in the solid and electrolyte phases is summarized. The electrode model is based on the porous electrode theory, and the lithium-ion concentration in a single spherical particle:

$$\frac{\partial c_s^{n,p}(x,r,t)}{\partial t} = \frac{D_s}{r^2}\frac{\partial}{\partial r}\left(\frac{\partial c_s^{n,p}(x,r,t)}{\partial r}\right) \quad (1)$$

where $$c_s(x,r,t):(0,L)\times(0,R_s^{n,p})\times R^+ \to [0,c_{s,max}^{n,p}]$$

is the concentration of Li+ in the solid particles. At the particle surface the rate at which ions exit or enter the particle equals the volumetric rate of chemical reaction $j^{li}$, while at the center of the particle the rate is equal to zero, written as the boundary conditions:

$$\left.\frac{\partial c_s^{n,p}}{\partial r}\right|_{r=0} = 0 \text{ and } \left.\frac{\partial c_s^{n,p}}{\partial r}\right|_{r=R_s^{n,p}} = \frac{-j^{li}}{D_s a_s F} \quad (2)$$

With initial conditions:

$$c_s^{n,p}(x,r,t_0) = c_{s_0}^{n,p}(x,r) \quad (3)$$

The Li+ concentration in the electrolyte changes due to flow of ions and the current. It can be described in the Cartesian coordinates $$\frac{\partial \varepsilon_e c_e(x,t)}{\partial t} = \frac{\partial}{\partial x}\left(D_e^{eff}\frac{\partial c_e(x,t)}{\partial t}\right) + \frac{1-t_0^+}{F}j^{li} \quad (4)$$

Where $$c_e(x,t):(0,L)\times R^+ \to [0,c_{e,max}]$$

is the concentration of Li+ in the electrolyte and $\varepsilon_e$ and $D_e^{eff}$ are domain (anode, cathode, separator) dependent parameters. The Bruggemans relation $D_e^{eff}=D_e\times\varepsilon_e^p$ accounts for the tortuous path of Li+ transport through the porous electrodes and separator. Ensuring zero flux at the current collector and continuity of concentration and flux through the adjoining domains within the cell, written as the boundary conditions:

$$\left.\frac{\partial c_e}{\partial c}\right|_{x=0} = 0 \text{ and } \left.\frac{\partial ce}{\partial x}\right|_{x=L} = 0 \quad (5)$$

With initial conditions:

$$c_e(x,t_0) = c_{eq(x)} \quad (6)$$

The electrical potential in the electrodes is derived from the Ohms law:

$$\frac{\partial}{\partial x}\left(\sigma^{eff}\frac{\partial}{\partial x}\phi_s(x,t)\right) - j^{li} = 0 \quad (7)$$

The potentials at the current collectors (x=0 and x=L) are proportional to the applied current and zero at the separator, written as boundary conditions:

$$-\sigma^{eff}\frac{\partial}{\partial x}\phi_s(x,t)\bigg|_{x=0} = -\sigma^{eff}\frac{\partial}{\partial x}\phi_s(x,t)\bigg|_{x=L} = \frac{I}{A} \quad (8)$$

$$\frac{\partial}{\partial x}\phi_s(x,t)\bigg|_{x=\delta_n} = \frac{\partial}{\partial x}\phi_s(x,t)\bigg|_{x=\delta_n+\delta_{sep}} = 0$$

The electrical potential in the electrolyte is derived from the charge conservation law:

$$\frac{\partial}{\partial x}\left(k^{eff}\frac{\partial}{\partial x}\phi_e(x,t)\right) + \frac{\partial}{\partial x}\left(k_D^{eff}\frac{\partial}{\partial x}\ln c_e\right) + j^{li} = 0 \qquad (9)$$

With initial conditions:

$$\frac{\partial}{\partial x}\phi_e(x,t)\bigg|_{x=0} = \frac{\partial}{\partial x}\phi_e(x,t)\bigg|_{x=L} = 0 \qquad (10)$$

The volumetric rate of chemical reaction at the solid/electrolyte interface is governed by the Butler-Volmer current density equation. This equation links the reaction rate to the phase potentials and is described as:

$$j^{li} = a_s j_0 \left[\exp\left(\frac{\alpha_a F}{RT}\eta\right) - \exp\left(\frac{\alpha_c F}{RT}\eta\right)\right] \qquad (11)$$

The overpotential 11 is defined as the difference between the cell's overpotential and its charge/discharge voltage. It is responsible for driving the electrochemical reaction, and can be calculated as follows:

$$\eta = \phi_s - \phi_e - U(c_{se}) \qquad (12)$$

The coefficient $j_0$ depends on the solid electrolyte concentrations $c_{se}$ according to the following equation:

$$j_0 = (c_e)^{\alpha_a}(c_{s,max} - c_{s,e})^{\alpha_a}(c_{se})^{\alpha_c} \qquad (13)$$

The cell potential across the cell terminals is determined as follows:

$$V = \phi_s(x=L) - \phi_s(x=0) - R_f\frac{I}{A} \qquad (14)$$

FIG. 2 describes the above explained electrochemical battery model, which can also be called Full Order Model (FOM). FIG. 2 is a block diagram which represents the coupled nonlinear partial differential equations in the full order electrochemical model.

The FOM is highly accurate, however it requires high computational time and on-board memory allocation that impedes its real time applications. Therefore, it is advantageous to reduce the FOM by simplifying the set of FOM equations for ion concentration and potential in electrode and electrolytes.

In the following, some assumption and simplifications to the FOM are considered in order to obtain an advantageous reduced order model (ROM) as shown in FIG. 3.

The FOM equations represented in equations (1) to (14) are simplified in order to be implemented in real-time applications. The following assumptions have been applied.

Assumption 1:

At low C-rates the change of Li concentration in electrolyte $c_e$ can be considered constant. Thus, the Lithium concentration in electrolyte $c_e$ can be assumed to be constant and uniform; this simplifies equation (4) to a constant average value.

Assumption 2:

Due to the averaging procedure in assumption 1, the driving force for the lithium diffusion across the electrode is constant and one particle from each electrode can represent the reaction. Thus, the solid particle distribution along the electrode can be neglected and the solid particle distribution along the electrode can be assumed to be a single sphere whose surface area is scaled to that of the porous electrode.

Assumption 3:

If aging effects are not included, all model parameters can be assumed to be constant (temperature, aging, and capacity fade has been neglected).

The above assumptions are summarized in the following equations. These reductions lead to the possibility of describing the diffusion sub-model with a single representative solid material particle for each electrode (anode and cathode).

$$\frac{\partial c_s(r,t)}{\partial t} = \frac{D_e}{r^2}\left(\frac{\partial^2 c_e(r,t)}{\partial r^2}\right) \qquad (15)$$

Since only one particle is to be considered from the anode and the cathode, the [x-dimension] can be ignored.

$$c_e(x,t) = c_e \qquad (16)$$

The lithium concentration in electrolyte $c_e$ is assumed to be constant, uniform, and equal to an average value.

$$\frac{\partial}{\partial x}\left(\sigma^{eff}\frac{\partial}{\partial x}\phi_e(x,t)\right) = \overline{j}_{n,p}^{li} \qquad (17)$$

$$\frac{\partial}{\partial x}\left(k^{eff}\frac{\partial}{\partial x}\phi_e(x,t)\right) = -\overline{j}_{n,p}^{li} \qquad (18)$$

The Lithium concentration in electrolyte is assumed to be constant, uniform, and equal to an average value.

$$\overline{j}_{n,p}^{li} = \frac{I}{A\delta_{n,p}} \qquad (19)$$

The Lithium concentration in electrolyte is assumed to be constant and one particle is to be considered from the each electrode, hence the spatial dependence of Butler-Volmer equation is considered to be a constant value.

The FOM set of equations is simplified due to the previous assumptions. The reduced order electrode averaged model (ROM) is summarized in equation (15) to (19). Its terminal voltage can be calculated by substituting equation (12) in equation (14):

$$V(t) = (\overline{\eta}_p - \overline{\eta}_n) + (\overline{\phi}_e^p - \overline{\phi}_e^n) + [U_p(\theta_p) - U_n(\theta_n)] - R_f\frac{I}{A} \qquad (20)$$

where $\overline{\eta}_p - \overline{\eta}_n$ is the difference between the positive and negative electrode over potentials, and can be calculated by substituting equation (19) in (11) as shown below:

$$\overline{\eta}_p - \overline{\eta}_n = \frac{RT}{\alpha_a F}\ln\frac{\xi_n + \sqrt{\xi_n^2 + 1}}{\xi_p + \sqrt{\xi_p^2 + 1}} \text{ where } \overline{\xi}_{n,p} = \frac{\overline{j}_{n,p}^{li}}{2a_s j_0} \qquad (21)$$

And $\overline{\Phi_e^p} - \overline{\Phi_e^n}$ is the difference between the positive and negative terminals electrolyte potentials, and can be represented by next equation:

$$\overline{\phi}_e^p - \overline{\phi}_e^n = -\frac{(\delta_n + 2\delta_{sep} + \delta_p)}{2A\kappa^{eff}} I \quad (22)$$

And $U_p(\theta_p) - U_n(\theta_n)$ is the difference between the open circuit voltage for the positive and negative electrolyte. The stoichiometry ratio $\theta_{n,p}$ is the normalized solid-electrolyte interface concentration for the negative and positives electrodes respectively.

$$\theta_{n,p} = \frac{\overline{c}_s^{n,p}}{c_{se,max}} \quad (23)$$

where $\overline{c}_s^{n,p}$ is the average bulk concentration, and can be obtained by calculating the total concentration volumetric average.

$$\overline{c}_s^{n,p} = \frac{1}{V_s} \int_0^{R_{n,p}} c_s^{n,p}(r,t) dV_s \quad (24)$$

The battery nominal capacity $C_{nom}$ can be determined by the mass of active material contained in a fully charged cell. It can be measured, for example, by calculating the maximum number of ampere-hours that can be drawn from the fully charged battery at room temperature (293 K) and very low C-rate (C/25). The volumetric averaged Li concentration can be determined by substituting $V_s = 4\pi R_s^3/3$ and $dV_s = 4\pi r^2 \, dr$ in equation (24).

$$\overline{c}_s^{n,p} = \frac{3}{R_s^3} \int_0^{R_s} r^2 c_s^{n,p}(r,t) dr \quad (25)$$

By using the boundary conditions in equations (2) and substituting equation (19) into equation (2), the volumetric averaged Li concentration dynamics in equation (25) become $$\dot{\overline{c}}_s^{n,p} = \frac{3D_s}{R_s^{n,p}} [R_s^{2n,p} c_s'(R_s^{n,p}, t)] = \frac{I}{\delta_{n,p} A \epsilon_s^{n,p} F} \quad (26)$$

The State of Charge (SOC) is defined as $$SOC = \frac{1}{\text{Capacity}(Ah)} \int_0^t I(\tau) d\tau \quad (27)$$

assuming the initial state of charge SOC(t=0)=0 and I(t) is the applied current with I>0 during charge. SOC can be defined as $$SOC = \frac{\theta_{n,p} - \theta_{0\%}}{\theta_{100\%} - \theta_{0\%}} \quad (28)$$

Using equations (26), (27), and (28), the capacity is defined as $$C = \frac{AF\delta_{n,p} \epsilon_s^{n,p} c_{s,max}^{n,p} [\theta_{100\%}^{n,p} - \theta_{0\%}^{n,p}]}{3600}, (Ah) \quad (29)$$

The governing Partial Differential Equations (PDEs) of the ROM constitute the building blocks of the battery model. To be useful for control and systems engineering, it is advantageous to discretize the PDEs in space to reduce them to coupled multiple ordinary differential equations (ODEs) in time domain.

The Finite Difference Method (FDM) is a very efficient approach to the solution of the diffusion equations found in the battery models for real time applications.

By using the central finite difference method for the radial dimension r, it is possible to express the spherical PDE into a set of ordinary differential equations (ODE).

Starting with equation (15) by solving along the r-dimension, it becomes $$\frac{\partial c_s(r,t)}{\partial t} = \left( D_s \frac{\partial^2 c_s}{\partial r^2} + \frac{2\partial c_s}{r \partial r} \right) \quad (30)$$

By using the central finite difference method, and discretizing the solid spherical particle into $M_r$ shells along the radial dimension r as shown in FIG. 1, such that $R_s = \Delta r \times (M_r)$ and defining $q=1; \ldots; M_{r-1}$ equation (30) becomes $$\dot{\overline{c}}_s^{n,p}|_q = \quad (31)$$

$$\frac{D_s}{\Delta r^2} \left[ (c_s^{n,p}|_{q+1} - 2c_s^{n,p}|_q + c_s^{n,p}|_{q-1}) + \frac{\Delta r}{r_q}(c_s^{n,p}|_{q+1} - c_s^{n,p}|_{q-1}) \right]$$

By substituting with $r_q = q \times \Delta r$ and rearranging, equation (31) becomes $$\dot{c}_s^{n,p}|_q = \frac{D_s}{\Delta r^2} \left[ \left(\frac{q-1}{q}\right) c_s^{n,p}|_{q-1} - 2c_s^{n,p}|_q + \left(\frac{q+1}{q}\right) c_s^{n,p}|_{q+1} \right] \quad (32)$$

The boundary conditions equation (2) can be rewritten as follows $$c_s^{n,p}|_0 = c_s^{n,p}|_1 \quad (33)$$

$$c_s^{n,p}|_{M_r} = c_s^{n,p}|_{M_{r-1}} + \Delta r \frac{-j^{li}}{Fa_s D_s} = c_{se}^{n,p} \quad (34)$$

By substituting with the boundary conditions equations (33) and (34), and rearranging, equation (32) becomes $$\dot{c}_s^{n,p} = \qquad (35)$$

$$\begin{cases} \Psi\left[-2c_s^{n,p}\big|_q + \left(\frac{q+1}{q}\right)c_s^{n,p}\big|_{q+1}\right]: & q=1 \\ \Psi\left[\left(\frac{q-1}{q}\right)c_s^{n,p}\big|_{q-1} - 2c_s^{n,p}\big|_q + \left(\frac{q+1}{q}\right)c_s^{n,p}\big|_{q+1}\right]: & 2 \le q \le M_r-2 \\ \Psi\left[\left(\frac{q-1}{q}\right)c_s^{n,p}\big|_{q-1} - \left(\frac{q-1}{q}\right)c_s^{n,p}\big|_q - \frac{Z}{\Psi}\left(\frac{q+1}{q}\right)j^{li}\right]: & q = M_r-1 \end{cases}$$

where $\psi = D_s/\Delta r^2$ and $Z = 1/(\Delta r \times a_s \times F)$. The lithium concentration in the solid particle at the outer shell when $r = M_r$ is referred to as the lithium concentration at the solid-electrolyte interface $c_{se}^{n,p}$.

With the above approximations for the mass conservation equation and its boundary conditions, a state space representation for equations (31) to (35) can be formulated as follows:

$$c_s^{n,p} = Ac_s^{n,p} + Bj^{li} \qquad (36)$$

$$c_{se}^{n,p} = c_s^{n,p}\big|_{M_r} = c_s^{n,p}\big|_{M_r-1} + Dj^{li} \qquad (37)$$

The state space matrices, A, B, and D are obtained as follows:

$$A = \Psi \begin{bmatrix} -2 & \frac{q+1}{q} & 0 & \cdots & 0 & 0 \\ \frac{q-1}{q} & -2 & \ddots & & 0 & 0 \\ 0 & \ddots & \ddots & \ddots & & \vdots \\ \vdots & & \ddots & \ddots & \ddots & 0 \\ 0 & 0 & & \ddots & -2 & \frac{q+1}{q} \\ 0 & 0 & \cdots & 0 & \frac{q-1}{q} & -\frac{q-1}{q} \end{bmatrix} \qquad (38)$$

$$B = Z \begin{bmatrix} 0 \\ 0 \\ 0 \\ \vdots \\ \vdots \\ \frac{q+1}{q} \end{bmatrix} \qquad (39)$$

$$D = -\frac{Z}{\Psi} \qquad (40)$$

The set of equations describing the reduced order electrode average model equation (15) to (40), can be summarized in FIG. 3. FIG. 3 is a block diagram which represents the reduced order electrode average model.

The ROM battery voltage equation can be rewritten by substituting equation (21), (22), (23) in equation (20) as shown below:

$$V(t) = [U_p(\theta_p) - U_n(\theta_n)] + \vartheta_\eta^{n,p}(\theta_{p,n},I) - IK_{resistive} \qquad (V)(41a)$$

where $$K_{resistive} = \frac{1}{A}\left[R_f + \frac{(\delta_n + 2\delta_{sep} + \delta_p)}{2\kappa^{eff}}\right] \qquad (\Omega)(41b)$$

where $K_{resistive}$ is a term that accounts for the increase in ohmic resistance during a charge or discharge current pulse related to the poor electronic conductivity of the cell chemistry.

By substituting $a_s = 3\epsilon_{n,p}/R_s^{n,p}$, and $\alpha_a = \alpha_c = 0.5$, equation (21) can be written as follows:

$$\vartheta_\eta^{n,p}(\theta_{p,n},I) = \overline{\eta}_p - \overline{\eta}_n = \frac{RT}{\alpha_a F}\ln\frac{\xi_n + \sqrt{\xi_n^2+1}}{\xi_p + \sqrt{\xi_p^2+1}} \qquad (V)(42a)$$

where $$\xi_{n,p} = \Omega^{n,p}\frac{I}{\left(c_{s,max}^{n,p}c_{se}^{n,p} - c_{se}^{n,p^2}\right)^{0.5}} \qquad (42b)$$

and $$\Omega^{n,p} = \frac{R_s^{n,p}}{6A\delta_{n,p}\epsilon_{n,p}(\overline{c}_e)^{0.5}} \qquad (42c)$$

where $\Omega^{n,p}$ is a constant term that accounts for the variation of the average electrolyte concentration. After introducing $\Omega^{n,p}$ and $K_{resistive}$ the new set of equations are described in FIG. 4, where the parameters with the reference sign c represent the model constants. FIG. 4 is a block diagram which represents the reduced order electrode average model with $\Omega^{n,p}$ and $K_{resistive}$.

Equations (36) to (40) that describe the lithium-ion concentration in a single spherical particle are linear time-invariant (LTI). The non linearity in the output equation (41) is due to the open circuit potential term $[U_p(SOC_p)-U_n(SOC_n)]$ and the over potential difference term $\vartheta_\eta^{n,p}(\theta_{p,n},I)$. The open circuit potential $[U_p(SOC_p)-U_n(SOC_n)]$ is a uni-variate non-linear function of the cell state of charge $U_{n,p}(SOC_{n,p})$ reducing this term to a continuous piecewise linear regions while maintaining accuracy aids in reducing the computational complexity of model.

The following section describes the use of piece-wise linearization techniques to reduce the system complexity.

In the following, a method is presented for constructing continuous piecewise linear regions of experimentally measured OCP data using polynomials of first order by stochastic global solution of the resulting mathematical problem. Due to constraints in real time applications, it is advantageous to maintain the continuity and smoothness of the OCP curve at the knot positions.

In the algorithm proposed in the following, the number of knots must be known and specified in advance. Second, the knots are not completely free on the fitting interval but rather are restricted to be unique and in order between the values in the finite set of measurements.

A two-stage framework of knot placement is proposed. It is started with an outline of the algorithm. Then the knot placement strategy and a genetic algorithm (GA) optimization model are described respectively.

The open circuit potential as a function of state of charge, $U_{n,p}(SOC_{n,p})$ is a uni-variate non-linear function where $SOC_{n,p} \in [SOC_{n,p}^{0\%}, SOC_{n,p}^{100\%}]$. This nonlinear function has N continuous piecewise linear functions $\omega_i(\theta)$ within its domain, where $\lambda$ is a pre-specified number that represents the knot points. Each line segment can be defined as follows:

$$\omega_i(SOC) = \quad (43)$$

$$\frac{U(\lambda_i) - U(\lambda_{i-1})}{\lambda_i - \lambda_{i-1}}(SOC - \lambda_{i-1}) + U(\lambda_{i-1}) \; \forall \; \lambda_{i-1} \le SOC \le \lambda_i$$

where $\lambda_i$ are knot points in $[SOC_{n,p}^{0\%}, SOC_{n,p}^{100\%}]$ and $\lambda = 1; \ldots; N$. The first and the last knot points are fixed at the boundaries, that is, $\lambda_0 = SOC^{0\%}$, $\lambda_N = SOC^{100\%}$. Also, the knot points are ordered and unique: $\lambda_i > \lambda_{i-1}$ for $\lambda = 1; \ldots; N$. To find the optimal placements for the knot points $\lambda_i \ldots, \lambda_{n-1}$ such that the overall squared-approximation error err is minimized. The optimization objective function is as follows:

$$\min_{\lambda_1, \ldots, \lambda_{N-1}} \left\{ err = \int_{SOC^{0\%}}^{SOC^{100\%}} [U(SOC) - \omega_i(SOC)]^2 \, dSOC \right\} \quad (44)$$

The final optimization problem can be described as follows:

$$\min_{\lambda_1, \ldots, \lambda_{N-1}} err(SOC) \quad (45a)$$

s.t.

$$\frac{derr(SOC)}{d(SOC)} = [U(SOC) - \omega_i(SOC)]^2, \; err(SOC^{0\%}) = 0 \quad (45b)$$

$$\omega_i(SOC) = \frac{U(\lambda_i) - U(\lambda_{i-1})}{\lambda_i - \lambda_{i-1}}(SOC - \lambda_{i-1}) + U(\lambda_{i-1}) \quad (45c)$$

for $\lambda_{i-1} \le SOC \le \lambda_i$ $$\lambda_0 = SOC^{0\%}, \; \lambda_N = SOC^{100\%} \quad (45d)$$

$$\lambda_i \ge \lambda_{i-1} + \epsilon, \; i = 1, \ldots, N \quad (45e)$$

The continuity constraint implies that $\omega(\lambda_{i+1}) = \omega(\lambda_i)$ and can be written as:

$$\lambda_i = -\frac{U(\lambda_i) - U(\lambda_{i-1})}{\lambda_i - \lambda_{i-1}}\lambda_{i-1} + U(\lambda_{i-1}) \quad (46)$$

The proposed method uses genetic algorithms (GA), which is inherently stochastic in nature. The GA is theoretically proven to eventually attain global convergence, its stochastic nature prevents any prediction or calculation of its rate of convergence. As a result, these routines can be computationally expensive in real-time calculations.

Since, the continuous piecewise linearization of the OCP will be performed offline, the real-time calculations constraint is not valid anymore. The problem can be solved to global optimality using GA, which guarantee that the resulting solution is globally optimal within an epsilon tolerance.

FIG. 5 shows the optimized knot locations and compares between the measurement and the piece-wise linear functions. In both parts of the graphs, the x-axis represents the normalized concentration, whereas, the y-axis represents OCP [V] and residuals [V] in upper and lower figures respectively. Round-off error at lower SOC is avoided by choosing the first piecewise linear region interval away from a steep portion of the OCP curve. The residuals graph shows the accuracy of the piecewise linear functions with respect to non-linear function, the coefficient of determination R-squared $R^2$ of the fitted functions is equal to 0.9997.

$$\lambda = [0.06, 0.23, 0.49, 0.78, 1] \quad (47)$$

By substituting in equation (43)

$$\omega(SOC_{n,p}) = \begin{cases} 0.82 SOC_p - 0.05 SOC_n + 3.42: \; 0.06 \le SOC_p \le 0.23 \\ 0.31 SOC_p - 0.05 SOC_n + 3.53: \; 0.23 \le SOC_p \le 0.49 \\ 0.69 SOC_p - 0.03 SOC_n + 3.34: \; 0.49 \le SOC_p \le 0.78 \\ 1.08 SOC_p - 0.02 SOC_n + 3.09: \; 0.78 \le SOC_p \le 1.00 \end{cases} \quad (48)$$

The continuous piecewise linear reduced order electrode averaged model (CPWL-EAM) terminal voltage can be calculated by substituting equations (21), (22), and (48) in equation (20) as shown in the following equation:

$$V(t) = \omega(SOC_{n,p}) + \frac{RT}{\alpha_a F} \ln \frac{\xi_n + \sqrt{\xi_n^2 + 1}}{\xi_p + \sqrt{\xi_p^2 + 1}} - I K_{resistive} \quad (49)$$

FIG. 6 shows a flowchart of a program for estimating a voltage of a battery. The program can be executed by a device 1. In this program the above described examples of the electrochemical battery model can be used and the above described linearization method.

In a step S1 the program is started and, for example, variables are initialized.

In a step S3 a given electrochemical battery model is provided, wherein one parameter of the electrochemical battery model is an open circuit potential. The given electrochemical battery model is, for example, one of the above described electrochemical battery models, as, for example, the ROM.

In a step S5 the open circuit potential is linearized. The open circuit potential is, for example, linearized as described above.

In a step S7 the voltage of the battery is estimated by means of the electrochemical battery model with the linearized open circuit potential, as, for example, by means of equation (49).

In a step S9 the program is stopped and can, for example, be restarted in the step S1.

By providing the above described method with, for example, the electrochemical battery model of FIG. 3 or 4, the voltage can be estimated in a very robust and accurate manner, wherein the estimation is up to 7 times faster than an estimation by means of the electrochemical battery model FIG. 2. Thus, a real time estimation of the state of charge (SOC), state of health (SOH), state of function (SOF) of the battery, power management, and thermal management, etc. is possible.

NOMENCLATURE

Acronyms

A State matrix in linear state variable model state equation
B Input matrix in linear state variable model state equation
D Input matrix in linear state variable model output equation
A Electrode plate area $cm^2$
$a_s$ Active surface area per electrode unit volume $cm^2 \; cm^{-3}$
c Concentration of lithium ions $mol \; cm^{-3}$
D Diffusion coefficient of lithium species $cm^2 \; s^{-1}$ F Farady's Constant (F=96,487) mC mol$^{-1}$
I Applied current A
$j^{li}$ Butler-Volmer current density A cm$^{-3}$
q Discretization step
R Universal gas constant (R=8.3143) J mol$^{-1}$K$^{-1}$
r Radial coordinate cm
$R_s$ Solid active material particle radius cm
T Absolute Temperature K
t Time s
$t_0^+$ Transference number of lithium ion
U Open circuit potential of an electrode reaction V
x Cartesian coordinate s
Greek Symbols
$\alpha_a$, $\alpha_c$ Anodic and cathodic charge transfer coefficients
δ Thickness cm
η Surface overpotential of an electrode reaction V
$\kappa_D$ Electrolyte phase diffusion conductivity Ω$^{-1}$ cm$^{-1}$
κ Electrolyte phase ionic conductivity Ω$^{-1}$ cm$^{-1}$
φ Volume averaged electrical potential V
σ Conductivity of solid active materials in an electrode Ω$^{-1}$ cm$^{-1}$
θ Reference stoichiometry
ε volume fraction or porosity—
Superscripts
+ ions
eff Effective
li Lithium
p Bruggeman exponent
e Electrolyte phase
n Anode
p Cathode
s Solid phase
s; e Solid phase at solid/electrolyte interface
s,max Maximum solid phase
sep Separator

We claim:

1. A method for estimating a voltage of and managing a battery, the method comprising:
providing a battery comprising a battery cell, wherein the battery cell comprises a positive electrode, a separator and a negative electrode;
taking a plurality of measurements of the battery;
providing an electrochemical model of the battery, wherein one parameter of the electrochemical model of the battery is an open circuit potential;
specifying a number of a plurality of knots, wherein the plurality of knots comprise unique values selected based on values established by the plurality of measurements and one or more of the plurality of knots are not any of the plurality of measurements;
linearizing the open circuit potential by generating a plurality of piece-wise linear functions based on the plurality of knots, each of the plurality of knots corresponding to each of the plurality of piece-wise linear functions, wherein generating the plurality of piece-wise linear functions comprises:
minimizing an overall squared-approximation error between a uni-variate non-linear function of the open circuit potential and the piece-wise linear functions of the knots by using an optimization objective function;
estimating a voltage of the battery using the electrochemical model of the battery with the linearized open circuit potential; and
determining, in real time and based on the estimated voltage of the battery, at least one of a state of charge of the battery, a state of health of the battery, a state of function of the battery, a power management of the battery, or a thermal management of the battery,
wherein:
the number of the plurality of knots is less than the number of the plurality of measurements.

2. The method of claim 1, wherein the number of the plurality of knots is four or five.

3. The method of claim 1, wherein the plurality of knots are placed on points based on the values established by the plurality of measurements such that the overall squared-approximation error is minimized.

4. The method of claim 3, wherein the overall squared-approximation error is minimized using the optimization objective function, $$\min_{\lambda_1,\ldots,\lambda_{N-1}} \left\{ err = \int_{SOC^{0\%}}^{SOC^{100\%}} [U(SOC) - \omega_i(SOC)]^2 \, dSOC \right\}$$

wherein: $\lambda_i$ is the point of the knot i;
U(SOC) is the uni-variate non-linear function of the open circuit potential;
x∈[SOC$^{0\%}$,SOC$^{100\%}$] and SOC is the state of charge of the battery;
err is the overall squared-approximation error; and
$\omega_i$(SOC) is the piece-wise linear function of the knot i.

5. The method of claim 1, wherein the electrochemical model of the battery is based on a single particle model.

6. The method of claim 1, wherein, in the electrochemical model of the battery, a Lithium concentration in an electrolyte ce is set as an average value.

7. The method of claim 1, wherein, in the electrochemical model of the battery, a solid particle distribution is set to be a single sphere whose surface area is scaled to that of a porous electrode.

8. The method of claim 1, wherein, in the electrochemical model of the battery, a spatial dependence of Butler-Volmer equation is set as a constant.

9. The method of claim 1, wherein the electrochemical model of the battery is based on a formula $$V(t) = (\overline{\eta_p} - \overline{\eta_n}) + (\overline{\Phi_e^p} - \overline{\Phi_e^n}) + [U_p(\theta_p) - U_n(\theta_n)] - R_f \frac{I}{A}$$

wherein:
$\overline{\eta_p}-\overline{\eta_n}$ is a difference between the positive electrode and the negative electrode over potentials;
$\overline{\Phi_e^p}-\overline{\Phi_e^n}$ is a difference between a positive electrolyte potential and a negative electrolyte potential;
$U_p(\theta_p)-U_n(\theta_n)$ is the open circuit potential; and $$R_f \frac{I}{A}$$

is a resistance multiplied by a current divided by an electrode plate area.

10. A device for the method of claim 1, wherein the device is configured to perform a process comprising: providing the electrochemical model of the battery;
linearizing the open circuit potential; estimating the voltage of the battery; and determining the at least one of the state of charge of the battery, the state of health of the battery, the state of function of the battery, the power management of the battery, or the thermal management of the battery.

11. The method of claim 1, wherein:

at least one of the plurality of knots is not any of the plurality of measurements; and the at least one of the plurality of knots is placed on a point between two of the plurality of measurements.

12. The method of claim 1, wherein:

the plurality of knots comprise two adjacent knots; and the two adjacent knots do not represent two adjacent measurements of the plurality of measurements.

13. The method of claim 1, wherein:

the linearized open circuit potential comprises a plurality of linear segments; and each of the plurality of linear segments is between adjacent knots of the plurality of knots.

14. The method of claim 1, wherein:

the plurality of measurements represent the plurality of measurements of a voltage of the battery; and the plurality of knots are in order.

* * * * *